United States Patent
Shoki et al.

(10) Patent No.: US 7,282,305 B2
(45) Date of Patent: Oct. 16, 2007

(54) REFLECTIVE MASK BLANK HAVING A PROGRAMMED DEFECT AND METHOD OF PRODUCING THE SAME, REFLECTIVE MASK HAVING A PROGRAMMED DEFECT AND METHOD OF PRODUCING THE SAME, AND SUBSTRATE FOR USE IN PRODUCING THE REFLECTIVE MASK BLANK OR THE REFLECTIVE MASK HAVING A PROGRAMMED DEFECT

(75) Inventors: Tsutomo Shoki, Tokyo (JP); Ryo Ohkubo, Tokyo (JP); Takeru Kinoshita, Tokyo (JP)

(73) Assignee: Hoya Corporation, Tokyo (JP)

( * ) Notice: Subject to any disclaimer, the term of this patent is extended or adjusted under 35 U.S.C. 154(b) by 416 days.

(21) Appl. No.: 10/789,990

(22) Filed: Mar. 2, 2004

(65) Prior Publication Data

US 2004/0175633 A1 Sep. 9, 2004

(30) Foreign Application Priority Data

| Mar. 3, 2003 | (JP) | ............................. 2003-056273 |
| Sep. 8, 2003 | (JP) | ............................. 2003-314999 |

(51) Int. Cl.
*G03F 1/00* (2006.01)

(52) U.S. Cl. ....................................................... 430/5
(58) Field of Classification Search ................... 430/5; 378/35; 428/428, 430
See application file for complete search history.

(56) References Cited

U.S. PATENT DOCUMENTS

| 6,042,995 | A | * | 3/2000 | White ........................ 430/311 |
| 6,641,959 | B2 | * | 11/2003 | Yan .............................. 430/5 |
| 6,723,475 | B2 | * | 4/2004 | Tsukamoto et al. ............ 430/5 |
| 7,045,254 | B2 | * | 5/2006 | Dettmann et al. ............. 430/5 |

FOREIGN PATENT DOCUMENTS

| JP | 7-333829 A | 12/1995 |
| JP | 8-213303 A | 8/1996 |

* cited by examiner

*Primary Examiner*—S. Rosasco
(74) *Attorney, Agent, or Firm*—Sughrue Mion, PLLC

(57) ABSTRACT

A reflective mask blank has a substrate (1) and a reflective multilayer film (3) formed on the substrate to reflect exposure light. The substrate has a base pattern (2) formed by a predetermined irregularity. On a surface of the reflective multilayer film formed on the base pattern, a step portion corresponding to the base pattern is formed as a programmed defect.

15 Claims, 4 Drawing Sheets

US 7,282,305 B2

REFLECTIVE MASK BLANK HAVING A PROGRAMMED DEFECT AND METHOD OF PRODUCING THE SAME, REFLECTIVE MASK HAVING A PROGRAMMED DEFECT AND METHOD OF PRODUCING THE SAME, AND SUBSTRATE FOR USE IN PRODUCING THE REFLECTIVE MASK BLANK OR THE REFLECTIVE MASK HAVING A PROGRAMMED DEFECT

This invention claims priority to prior Japanese applications JP 2003-56273 and 2003-314999, the disclosures of which are incorporated herein by reference.

BACKGROUND OF THE INVENTION

This invention relates to a reflective mask blank having a programmed defect (or artificial defect) and a reflective mask having a programmed defect for use in inspection or evaluation of a reflective mask for exposure for use in pattern transfer in a semiconductor process and a reflective mask blank for use in producing the reflective mask. This invention also relates to a method of producing the reflective mask blank having a programmed defect and a method of producing the reflective mask having a programmed defect.

In the semiconductor industry, reduction in size of a semiconductor device is more and more accelerated in recent years. Following the reduction in size of the semiconductor device, an exposure technique capable of achieving higher resolution is required. As the exposure technique of the type, attention is directed to an EUV (Extreme Ultra Violet) lithography using EUV light. It is noted here that the EUV light is a radiation having a wavelength within a soft X-ray region or a vacuum ultraviolet region, specifically, within a range between about 0.2 and 100 nm. As a mask used in the EUV lithography, reflective masks for exposure are proposed in Japanese Patent Application Publications (JP-A) Nos. H08-213303 and H07-333829.

The reflective mask of the type comprises a substrate, a reflective multilayer film formed on the substrate to reflect light, a buffer layer formed on the reflective multilayer film, and an absorber film formed on the buffer layer in a predetermined pattern to absorb light. In an exposure apparatus, light incident to the reflective mask is partially absorbed in an area where the absorber film is present and is partially reflected by the reflective multilayer film in a remaining area where the absorber film is not present. The former area and the latter area may be referred to as an absorbing region and a reflecting region, respectively. An image formed by the light reflected by the reflective multilayer film is transferred onto a wafer through a reflection optical system. Herein, the buffer layer serves to protect the reflective multilayer film when the predetermined pattern of the absorber film is formed by dry etching or the like in a mask production process.

Generally, evaluation of a transferability of a mask used in pattern transfer in a semiconductor process and inspection of a defect of the mask are carried out by the use of a mask or a mask blank provided with a programmed defect formed at a predetermined position. For example, in order to carry out a transferability test or a defect inspection for a white defect (a part where the absorber film is lost) or a black defect (a part where the absorber film is excessive) formed on the mask, preparation is made of a mask having a programmed defect or a mask blank having a programmed defect in which a programmed defect, i.e., a white defect (a clear defect) or a black defect (an opaque defect), having a predetermined size is preliminarily formed at a predetermined position. The mask or the mask blank having a programmed defect is evaluated for the transferability or used as a reference sample in the inspection to calibrate the sensitivity of an inspection apparatus and to quantitatively evaluate a defect in a product.

If the above-mentioned reflective mask has an irregularity formed on a mask surface in the vicinity of the pattern, the reflected light will be changed in phase due to the irregularity. The change in phase results in degradation in positional accuracy and contrast of a transferred pattern. A defect causing the change in phase affecting the transferability may be called a phase defect.

In case of the existing photolithography, exposure light has a relatively long wavelength within an ultraviolet region (between 150 and 247 nm). Therefore, even if the irregularity is produced on the mask surface, the phase defect is hardly caused. Such irregularity produced under an ordinary manufacturing condition results in no serious problem. Further, even if the irregularity is formed, a wide tolerance is assured. Therefore, it is not essential to inspect or evaluate the phase defect.

However, in case where short-wavelength light, such as the EUV light, is used as the exposure light, the change in phase is very sensitive with respect to a microscopic irregularity on the mask surface, resulting an increase in influence upon a transferred image. Therefore, the change in phase resulting from such a very small irregularity is not negligible. For example, in case where the EUV light having a wavelength of about 13 nm, even the irregularity of about 2 nm may become the phase defect.

Therefore, in the lithography in a short-wavelength region, it is essential to research or evaluate the influence of the phase defect in the mask upon the transferred pattern and to quantitatively inspect the phase defect in production of the mask or the mask blank.

In order to evaluate or inspect the phase defect in the above-mentioned reflective mask, it is necessary to prepare a mask having a programmed defect or a mask blank having a programmed defect in which a phase defect of a predetermined size is preliminarily formed. However, such a reflective mask blank having a programmed defect or such a reflective mask having a programmed defect for use in inspection and evaluation is not known so far. Further, as the phase defect, a microscopic irregularity on the order of several nanometers must be formed. However, any technique for forming such a microscopic phase defect on the reflective multilayer film at a particular position with a particular size is not known.

In defect inspection, the reflective multilayer film must have a flat and smooth film surface in view of the sensitivity of a defect inspection apparatus. At present, such a mask blank having a programmed defect in which the reflective multilayer film has a flat and smooth surface and a method of producing the same are not known.

SUMMARY OF THE INVENTION

It is therefore an object of this invention to provide a reflective mask blank having a programmed defect in which the programmed defect having a desired size and a desired shape is formed at a desired position and which is adapted to be used in evaluation and defect inspection of a reflective mask blank.

It is another object of this invention to provide a reflective mask having a programmed defect in which the programmed defect having a desired size and a desired shape is formed at a desired position and which is adapted to be used in evaluation and defect inspection of a reflective mask.

It is still another object of this invention to provide a method of producing the above-mentioned reflective mask blank having a programmed defect.

It is yet another object of this invention to provide a method of producing the above-mentioned reflective mask having a programmed defect.

As a result of study of the present inventor, it has been found out that, by preliminarily forming a predetermined base pattern on a substrate and then forming a reflective multilayer film on the substrate with the base pattern formed thereon to thereby introduce a step portion into the reflective multilayer film, a reflective mask blank having a programmed defect and a reflective mask having a programmed defect can be obtained in which the programmed defect having a desired size and a desired shape is formed at a desired position with high controllability.

Based on the finding, the present inventor has completed this invention having following structures.

Structure 1

A reflective mask blank having a programmed defect, comprising a substrate and a reflective multilayer film formed on the substrate to reflect exposure light incident to the reflective multilayer film, the reflective multilayer film having a principal surface provided with a step portion for causing a phase change in reflected light obtained by reflecting the exposure light.

Structure 2

A reflective mask blank having a programmed defect, comprising a base body comprising a substrate and a reflective multilayer film formed on the base body to reflect exposure light incident to the reflective multilayer film, the base body having a principal surface provided with a base pattern comprising a predetermined irregularity, the reflective multilayer film formed on the base pattern having a principal surface provided with a step portion corresponding to the base pattern so that the reflective multilayer film has the programmed defect.

Structure 3

A reflective mask blank having a programmed defect according to structure 2, wherein the base pattern is formed by a patterned thin film.

Structure 4

A reflective mask blank having a programmed defect according to structure 3, wherein the thin film forming the base pattern is made of a material containing Cr or Ta as a main component.

Structure 5

A reflective mask blank having a programmed defect according to structure 4, wherein the thin film forming the base pattern is made of a material containing Cr and at least N or a material containing Ta and at least B.

Structure 6

A reflective mask blank having a programmed defect according to any one of structures 2 through 5, further comprising a base intermediate film formed between the base pattern and the reflective multilayer film.

Structure 7

A reflective mask blank having a programmed defect according to any one of structures 1 through 6, wherein the reflective multilayer film comprises Mo and Si films alternately laminated.

Structure 8

A reflective mask blank having a programmed defect according to any one of structures 1 through 7, further comprising an absorber layer made of a material absorbing the exposure light and formed on the reflective multilayer film.

Structure 9

A reflective mask blank having a programmed defect according to any one of structures 1 through 8, wherein the exposure light is EUV light.

Structure 10

A reflective mask blank having a programmed defect according to any one of structures 1 through 9, wherein the reflective multilayer film has a surface roughness greater than 0 nm and not greater than 0.2 nm in root-mean-square roughness (Rms).

Structure 11

A reflective mask having a programmed defect, comprising a reflective mask blank having a programmed defect described in structure 8 and a mask pattern formed on the absorber layer of the reflective mask blank.

Structure 12

A substrate for use in producing a reflective mask blank having a programmed defect or a reflective mask having a programmed defect, the base body having a principal surface with a patterned thin film formed thereon to provide a predetermined irregularity on the principal surface.

Structure 13

A method of producing a reflective mask blank comprising a base body comprising a substrate and a reflective multilayer film formed on the base body to reflect exposure light, the method comprising the steps of:

forming a base pattern comprising a predetermined irregularity on a principal surface of the base body; and forming the reflective multilayer film on the base pattern to thereby form a step portion on a principal surface of the reflective multilayer film corresponding to the base pattern so that a programmed defect is formed on the reflective multilayer film;

the reflective multilayer being deposited by sputtering in a condition that the base body is faced to a surface of a sputter target for deposition of the multilayer reflective film and the base body is rotated around a rotation axis which is a normal passing through the center of the principal surface of the base body.

Structure 14

A method of producing a reflective mask blank according to structure 13, wherein the base body is placed so that the principal surface of the base body is inclined at an angle with respect to the surface of the sputter target.

Structure 15

A method of producing a reflective mask blank according to structure 14, wherein the angle of the base body with respect to the surface of the sputter target is controlled to thereby control at least one of the height, the size, and the shape of the step portion formed on the principal surface of the reflective multilayer film.

Structure 16

A method of producing a reflective mask blank according to any one of structures 13 through 15, wherein an absorber layer made of a material absorbing the exposure light is formed on the reflective multilayer film.

Structure 17

A method of producing a reflective mask, the method comprising the step of preparing a reflective mask blank having a programmed defect by a method according to structure 16 and forming a mask pattern on an absorber layer of the reflective mask blank.

DESCRIPTION OF THE PREFERRED EMBODIMENTS

Figure 1A:
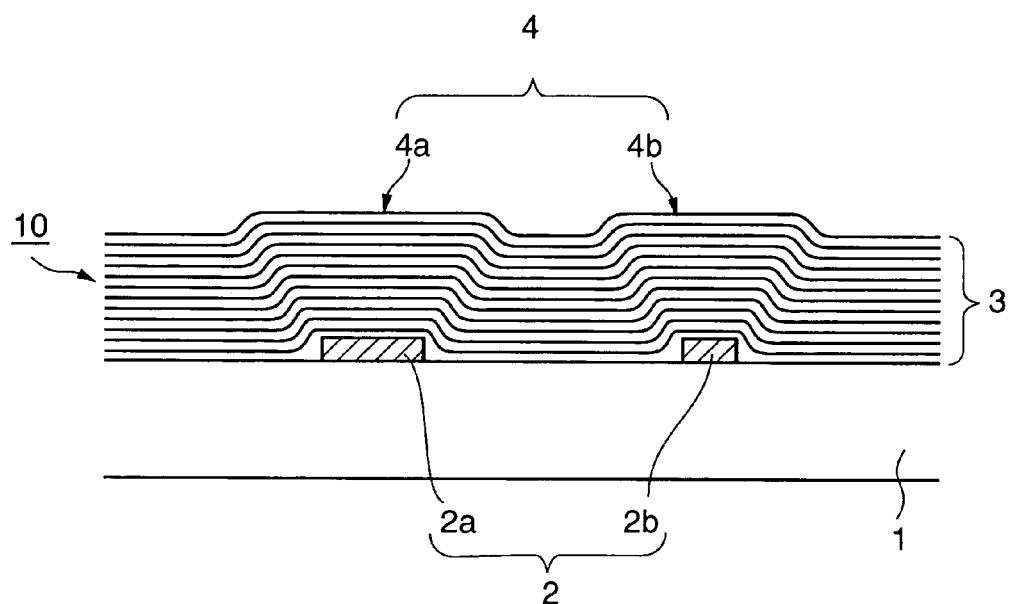
FIG. 1A is a sectional view of a reflective mask blank having a programmed defect according to an embodiment of this invention.

Now, description will be made about this invention with reference to the drawing.

Referring to FIG. 1A, a reflective mask blank having a programmed defect according to one embodiment of this invention comprises a substrate 1, a plurality of base patterns 2 each of which has a predetermined size and a predetermined shape and is formed at a predetermined position on the substrate 1, and a reflective multilayer film 3 which covers an entire surface of the substrate 1 with the base patterns 2 formed thereon. The reflective multilayer film 3 is provided with a plurality of step portions following irregularities formed by the base patterns 2 to provide a plurality of protrusions or bumps 4 defined by the step portions. In this embodiment, the protrusions 4 are formed as a programmed defect on the reflective multilayer film 3 at positions corresponding to the base patterns 2 each of which has a convex shape and is formed on the substrate 1 in an island pattern. Thus, the presence of the base patterns 2 causes the protrusions 4 defined by the step portions to be formed as programmed defects on the reflective multilayer film 3 formed on the base patterns 2. In FIG. 1A, the base patterns 2 include two different types of base patterns 2a and 2b different in width. Corresponding to the base patterns 2a and 2b, protrusions 4a and 4b different in shape are formed on the reflective multilayer film 3.

Next, the base patterns 2 formed on the substrate 1 will be described in detail.

The base patterns 2 have a function of forming the irregularities on the substrate 1. Based on the irregularities of the base patterns 2, the defects comprising the step portions are introduced into the reflective multilayer film 3. For example, the base patterns 2 may be provided by forming a thin film on the substrate 1 and patterning the thin film. Alternatively, the base patterns 2 may be formed directly on the substrate 1. In comparison, the technique of forming the thin film on the substrate and patterning the thin film is advantageous in that patterning is easy, a pattern shape is highly controllable, and a pattern having a flat and smooth surface is easily obtained.

In the meanwhile, if the reflective mask having a programmed defect or the reflective mask blank having a programmed defect is used as a blank sample in an exposure performance test or a defect inspection, various samples with various defects different in size and shape will be required.

Therefore, the shape of the base pattern is designed in correspondence to the shape of a desired defect. In FIG. 1A, the base patterns 2 having a rectangular section are formed on the substrate 1.

The planar shape of the base pattern may be any shape, such as a dot-like or a line-like shape, in dependence upon the purpose of evaluation or inspection. The reflective multilayer film is provided with the programmed defect of a dot-like or a line-like shape following the shape of the base pattern.

In the reflective mask blank illustrated in FIG. 1A, the reflective multilayer film 3 formed on the base patterns 2 has defective portions gradually increased in width towards an upper part of the reflective multilayer film 3. Therefore, each of the protrusions 4a and 4b formed on the surface of the reflective multilayer film 3 as the programmed defects has a width greater than that of each of the protrusions of the base patterns 2a and 2b by a predetermined width. The planar shape of each of the protrusions 4a and 4b as the defects is greater than that of the protrusion of each of the base patterns 2a and 2b.

Figure 1B:
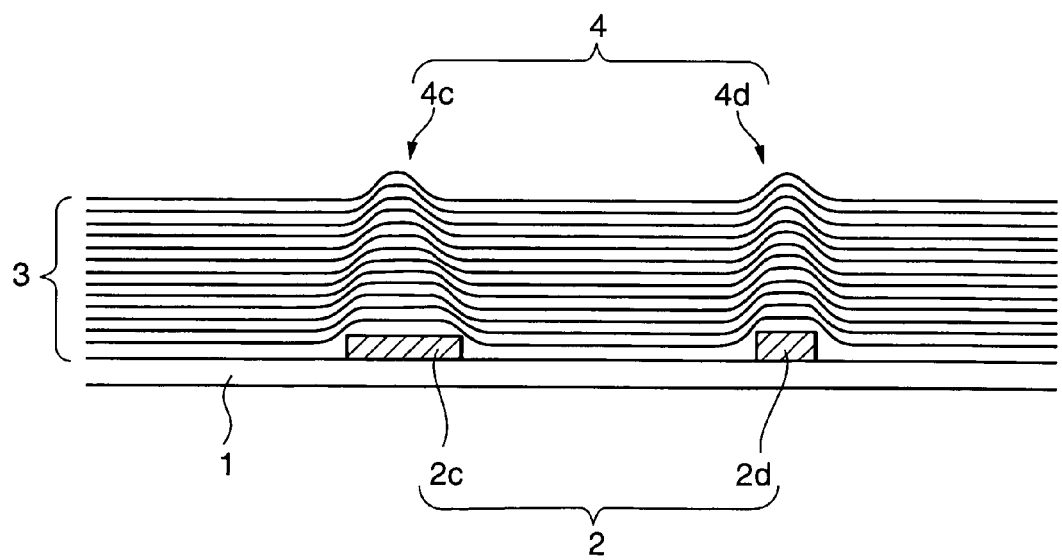
FIG. 1B is a sectional view of a reflective mask blank having a programmed defect according to another embodiment of this invention.

On the other hand, in a reflective mask blank illustrated in FIG. 1B, the reflective multilayer film 3 formed on the base patterns 2 has defective portions gradually reduced in width towards the upper part of the reflective multilayer film 3. Therefore, each of the protrusions 4c and 4d formed on the surface of the reflective multilayer film 3 as the programmed defects has a width smaller than that of each of the protrusions of the base patterns 2c and 2d by a predetermined width. The planar shape of each of the protrusions 4c and 4d as the defects is smaller than that of the protrusion of each of the base patterns 2c and 2d.

The shapes of the protrusions formed on the surface of the reflective multilayer film as illustrated in FIGS. 1A and 1B may easily be controlled by appropriately controlling a deposition condition of the reflective multilayer film as will later be described.

In FIGS. 1A and 1B, the height of each of the protrusions 4a, 4b, 4c, and 4d formed on the surface of the reflective multilayer film 3 is substantially equal to or smaller than that of each of the base patterns 2a, 2b, 2c, and 2d. Generally, the protrusions 4a, 4b, 4c, and 4d are not similar in sectional shape to the base patterns 2a, 2b, 2c, and 2d, respectively. Even if the defect is formed on the reflective multilayer film formed on the base pattern having a rectangular section, the defect tends to have an outer peripheral side surface with a gentle slope without rectangular corners. Generally, in case where the base pattern having a rectangular section is used, the defect formed on the reflective multilayer film has an upper surface in a shape with a substantially flat center portion and a peripheral slope as illustrated in FIG. 1A or in a gentle convex shape without the flat center portion as illustrated in FIG. 1B. As the width of the protrusion of the base pattern is greater, the flat center portion of the defect is widened. If the width of the base pattern is small, the flat center portion of the defect is reduced. As the thickness of the reflective multilayer film 3 is increased, the size (width) of the protrusion 4 as the defect is increased with respect to the size (width) of the base pattern 2.

Figure 1C:
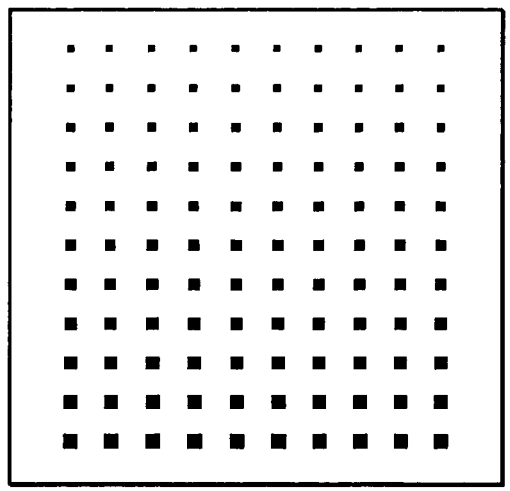
FIG. 1C is a plan view of a reflective mask blank having a programmed defect according to still another embodiment of this invention.

The base patterns may comprise not only two different kinds of protrusions (dot patterns) different in size (width) but also a plurality of kinds of protrusions different in size (width) and arranged on the principal surface of the substrate at equal intervals as illustrated in FIG. 1C.

The shapes of the base patterns formed on the substrate are designed taking into account the relationship with the shapes of the programmed defects formed on the reflective multilayer film. The relationship between the shapes of the base patterns and the shapes of the defects is preliminarily investigated and, with reference to the relationship, the base patterns are designed so as to obtain the defects in desired shapes. The relationship between the shapes of the base patterns and the shapes of the defects is variable depending upon the deposition technique, the material, and the layer structure (thickness and the number of layers) of the reflective multilayer film. Therefore, these parameters are preliminarily determined in conformity with the structure of a reflective mask blank product and a reflective mask product to be subjected to evaluation and inspection by the use of the mask blank having a programmed defect and the mask having a programmed defect. Although depending upon the type of evaluation or inspection, the base pattern generally has a height on the order of 1-100 nm and a width on the order of 20-300 nm.

Preferably, the mask blank having a programmed defect or the mask having a programmed defect according to this invention has a defect as exactly as identical in shape to that produced in actual manufacture of a reflective mask blank product and a reflective mask product.

In the actual manufacture of the reflective mask blank product and the reflective mask product, the defect is caused by the presence of a foreign matter on a glass substrate, mixture of a foreign matter during deposition of the reflective multilayer film, or disturbance in periodic structure of the reflective multilayer film during deposition.

Figure 2A:
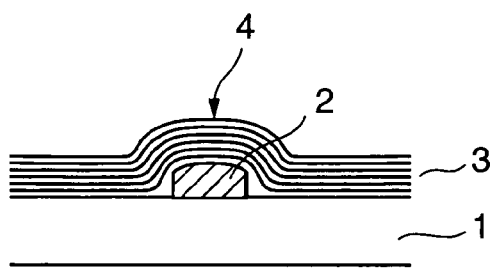
FIGS. 2A and 2B are sectional views for describing base patterns adapted to form defects having upper surfaces as convex surfaces, respectively.
Figure 2B:
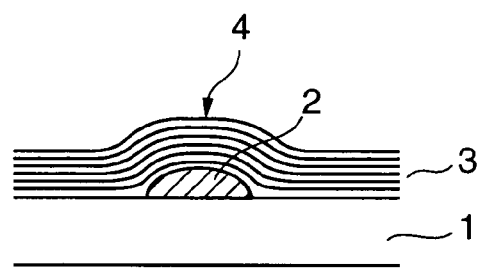

The defect produced as mentioned above often has an upper surface as a convex curved surface. In order to artificially form the defect having the upper surface as the convex curved surface, use may be made of a method of controlling the deposition condition of the reflective multilayer film as in the embodiment shown in FIG. 1B or a method of changing the shape of the base pattern. The method of changing the shape of the base pattern is a method of forming the upper surface of the base pattern into a curved surface. For example, as illustrated in FIG. 2A, the base pattern 2 having a convex curved surface on the upper surface is used. Alternatively, as illustrated in FIG. 2B, the base pattern 2 having a curved surface, such as a semispherical surface, as a whole of the upper surface is used. In the above-mentioned manner, the protrusion 4 having a convex curved surface as its upper surface can easily be obtained as the defect.

In most cases, the defect produced in actual manufacture of the reflective mask blank product and the reflective mask product has a convex shape. Therefore, as illustrated in FIGS. 1A though 1C, the base patterns 2 having a convex shape are formed on the substrate 1 as dot-like or line-like patterns and the reflective multilayer film 3 is formed thereon to produce the mask blank or the mask having the multilayer reflective film preliminarily provided with the defects having a predetermined convex shape. By the use of the mask blank or the mask thus produced, it is possible to evaluate or inspect the convex defect in the actual product. The convex base patterns are obtained by forming a thin film on the substrate and removing the most part of the thin film to locally leave the convex patterns.

On the other hand, in order to evaluate or inspect a phase defect of a concave shape produced in actual manufacture of the reflective mask blank product and the reflective mask product, concave base patterns are prepared by forming a thin film on the substrate and removing a part of the thin film to form concave portions without the thin film as dot-like or hole-like or line-like patterns. Alternatively, the concave base patterns are formed by directly forming concave portions on the principal surface of the substrate as dot-like or hole-like or line-like patterns. In the former case, by removing a part of the thin film and leaving the most part of the thin film, the base patterns having the concave portions can be formed.

The reflective multilayer film formed on the base patterns described above is provided with concave defects following the shape of the concave portions. Therefore, it is possible to evaluate or inspect the concave defect.

The base patterns having a concave shape may be designed in the manner similar to the base pattern of a convex shape described above. That is, the relationship between the base patterns and the programmed defects is preliminarily obtained and, with reference to the relationship, the base patterns are designed. It is noted here that, in case of the concave defect, the size (width) of the programmed defect is reduced with respect to the size (width) of the concave portion of the base pattern.

In case where the base pattern is formed by patterning the thin film formed on the substrate, the material of the thin film preferably has following characteristics.

(1) To be able to obtain a flat and smooth pattern surface in order to assure flatness and smoothness of the reflective multilayer film formed thereon. Preferably, the surface roughness is not greater than 0.3 nmRms.

(2) To have a sufficiently high etch selectivity to the substrate during formation of the pattern so as to prevent the substrate from being damaged. For example, to be able to prevent the surface of the substrate from being roughened by pattern formation. Preferably, the etch selectivity to the substrate is not smaller than 20.

(3) To be sufficiently resistant against acid and alkali typically used in cleaning the mask. In order to form a pattern exactly as designed with high profile accuracy, the stress of the thin film is preferably as small as possible.

As a material satisfying the above-mentioned characteristics, a material containing Cr or Ta as a main component is preferable. Being a main component means that the ratio of a metal element (composition ratio given by atomic %) is highest among metal elements contained in the material.

At first, description will be made of the material containing Cr as a main component.

The material containing Cr as a main component contains a Cr elemental metal or a Cr alloy. The material containing Cr as a main component is excellent in surface flatness and smoothness. If the substrate is made of a quartz glass or a low-expansion glass such as a $SiO_2$-$TiO_2$ glass and a film made of the material containing Cr as a main component is formed on the substrate, the film containing Cr as a main component can be patterned by dry etching using a mixed gas of chlorine and oxygen without giving substantially no damage to the substrate. The flatness and smoothness of the surface is further improved if the material containing Cr as a main component has a microcrystalline structure or an amorphous structure.

The material having a microcrystalline structure is obtained by addition of nitrogen (N) to Cr. The content of N is preferably 5-50% in atomic number. For example, use is preferably made of a chromium nitride film containing 20% N and having a microcrystalline structure. Addition of nitrogen improves acid resistance and stress controllability. On the other hand, if the content of nitrogen is excessively large, the surface roughness of the film is roughened.

As the film containing Cr as a main component, a material containing Cr and at least one of N, O, and C added thereto may be used instead of chromium nitride. For example, chromium oxide, chromium oxynitride, chromium carbide, chromium carbonitride, and chromium oxycarbonitride may be used.

The material containing Ta as a main component contains a Ta elemental metal or a Ta alloy. The material containing Ta as a main component is excellent in surface flatness and smoothness as well as in stress controllability. If the substrate is made of a quartz glass or a low-expansion glass such as a $SiO_2$-$TiO_2$ glass and a film made of the material containing Ta as a main component is formed on the substrate, the film containing Ta as a main component can be patterned by low bias dry etching using a chlorine gas without giving substantially no damage to the substrate. The flatness and smoothness of the surface is further improved if the material containing Ta as a main component has a microcrystalline structure or an amorphous structure.

For example, the microcrystalline structure or the amorphous structure is readily implemented by addition of B, Si, or Ge to Ta. In case where the amorphous structure or the microcrystalline structure is given, the surface roughness of 0.2 nmRms or less can be obtained. Among others, the material containing Ta and B is particularly preferable. In case of the material containing Ta and B, the microcrystalline structure or the amorphous structure is obtained by selecting the ratio of Ta and B so that Ta/B in atomic number falls within a range between 8.5/1.5 to 7.5/2.5. In particular, $Ta_4B$ containing 20% B is easily given the amorphous structure so as to achieve excellent flatness and smoothness.

In order to impart various characteristics, the material containing Ta as a main component may contain oxygen and/or nitrogen besides the above-mentioned metal components. For example, use may be made of a material containing Ta and N (TaN), a material containing Ta, B, and 0 (TaBO), a material containing Ta, B, and N (TaBN), a material containing Ta, B, N, and 0 (TaBNO), a material containing Ta and Si (TaSi), a material containing Ta, Si, and N (TaSiN), a material containing Ta and Ge (TaGe), and a material containing Ta, Ge, and N (TaGeN). Addition of N and/or O to Ta improves oxidization resistance so as to improve stability over time.

The material containing Ta, B, and N is preferable also. Inclusion of N improves oxidation resistance. In case of the material containing Ta, B, and N, the amorphous structure or the microcrystalline structure can readily be obtained If the material contains 5-30 at % N and, with respect to the balance assumed to be 100, 10-30 at % B. For example, the material of the amorphous structure can be obtained by addition of 15 at % B and 10 at % N to Ta as a main component.

As a thin film material for producing the base pattern, tungsten nitride (WN) or titanium nitride (TiN) may be used instead of the material containing Ta or Cr as a main component.

Next, description will be made of a method of forming the base pattern by patterning the thin film formed on the substrate.

(1) At first, the Substrate is Prepared.

As the substrate, use is preferably made of a material having a low thermal expansion coefficient and excellent in flatness and smoothness, and resistant against a cleaning liquid used in cleaning an EUV mask. For example, a glass having a low thermal expansion coefficient, such as a $SiO_2$-$TiO_2$ glass may be used. Without being restricted thereto, it is possible to use a substrate such as a crystallized glass with β-quarts solid solution deposited therein, a quartz glass, silicon, and metal. As a metal substrate, Invar alloy (Fe-Ni alloy) may be used. Preferably, the substrate has a flat and smooth surface having a surface roughness of 0.2 nmRms or less and a flatness of 100 nm or less in order to achieve high reflectivity and transfer accuracy.

(2) The Thin Film for the Base Pattern is Formed on the Substrate.

The film containing Ta or Cr as a main component is formed on the substrate. The film is uniformly formed on the substrate in a portion to serve as a mask region. The film is formed on the substrate by appropriately using an ordinary deposition technique, for example, sputtering. In case of a chromium nitride film, sputtering is carried out using a Cr target and a gas containing nitrogen as a sputter gas. In case of a Ta-B alloy, sputtering is carried out using a target containing Ta and B.

The thickness of the film is designed with reference to the relationship with the shape of the programmed defect to be formed. In case of a rectangular pattern, the thickness of the film is substantially same as the height of the desired defect. Depending upon the deposition technique, the height of the defect is smaller than that of the pattern and the width of the defect may be smaller than that of the pattern. If the upper surface of the base pattern is a convex curved surface, the height of the defect produced on the surface of the reflective multilayer film formed thereon tends to be low as compared with the case where the base pattern has a rectangular section, although depending upon the deposition technique. In this event, the height of the base pattern is selected to be slightly higher than that of the desired defect to be formed on the surface of the reflective multilayer film.

(3) The Pattern is Formed on the Thin Film.

A predetermined pattern corresponding to the shape, the size, and the position of the desired defect is formed on the thin film formed on the substrate. For the pattern, any desired shape, such as a dot-like or a line-like planar shape, may be selected. In order to form the pattern, use may be made of lithography. The lithography is excellent in controllability of the pattern shape so that the pattern is formed with high accuracy.

For example, a resist pattern corresponding to the predetermined pattern to be prepared is formed on the thin film. The resist pattern is formed by direct electron beam (EB) writing to a resist film or by light exposure and development. Using the resist pattern as a mask, the thin film is etched. Etching may be either dry etching or wet etching. For example, the thin film containing Ta as a main component may be etched by dry etching using a gas containing chlorine. The thin film containing Cr as a main component may be etched by dry etching using a gas containing chlorine and oxygen or wet etching using a Cr remover (cerium ammonium nitrate+perchloric acid+pure water). In case where a concave pattern is formed at a part of the thin film, these etching techniques are also particularly useful.

Upon etching, it is desired to select the etching gas and the etching technique such that the etch selectivity between the substrate and the thin film is large so as to suppress and prevent the substrate surface from being damaged by etching.

On the other hand, without forming the pattern on the thin film uniformly formed throughout the mask region, the base pattern may be formed by the technique of locally depositing a film on the substrate. For example, vapor deposition, sputtering, and CVD may be used. Specifically, a mask pattern having a predetermined opening is preliminarily formed on the substrate as desired. A film is deposited throughout an entire area including the opening of the mask pattern. Thereafter, the mask pattern and the film formed thereon are removed. Thus, a base pattern of a convex shape is formed on the substrate by the film deposited in the opening of the mask pattern. As the mask pattern, a resist material or the like may be used.

Without using the mask pattern, the film may directly be deposited locally. In order to form the base pattern directly on the substrate, FIB (Focused Ion Beam) or EB (electron beam) may be used.

For example, FIB or EB is locally irradiated onto the substrate and a gas is supplied onto the substrate to thereby deposit the base pattern at that portion. As ions of the FIB, gallium ions may be used. In case of FIB, for example, the base pattern made of carbon may be formed by the use of a gas containing carbon. In case of EB, for example, the base pattern made of platinum may be formed by the use of a gas containing platinum.

The method of forming the base pattern directly on the substrate is advantageous in that the base pattern can be formed without damaging the remaining part of the substrate. Furthermore, a microscopic pattern can easily be formed. For example, a microscopic pattern having a width on the order of 50 nm can be formed with the FIB while a microscopic pattern having a width on the order of 10 nm can be formed with the EB. This method is useful when the base pattern having a very small width and a very small height is formed.

On the other hand, the method of forming the thin film on the substrate and forming the pattern on the thin film is excellent in that a plurality of base patterns can uniformly be formed at the same height and relatively high base patterns can be formed with high controllability.

At any rate, depending upon the shape of the base pattern as required, the method of forming the base pattern is appropriately selected.

Further, the base pattern having the upper surface as a convex curved surface as described in conjunction with FIGS. 2A and 2B may be produced as follows.

A predetermined resist pattern is formed on a thin film. The resist pattern is heat treated so that the upper surface of the resist pattern is rounded into a curved surface. With the resist pattern as a mask, dry etching is carried out to transfer the shape of the curved surface of the resist pattern to the thin film.

In order to form a concave shape defined by a curved surface, a resist pattern having a predetermined opening is formed on the thin film. Through the opening, the thin film is contacted with an etching liquid. If the opening is very small, a concave portion having a generally semicircular section is formed in the thin film.

In order to form the curved surface, it is possible to directly and locally form the thin film on the substrate by the FIB or the like or to directly etch the substrate.

Thus, so as to obtain a phase defect of a desired shape on the reflective multilayer film, the shape of the base pattern is determined. In accordance with the shape of the base pattern thus determined, the method of forming the base pattern is appropriately selected. For example, by a plurality of etching steps, it is possible to form a relatively complicated shape.

In the above-mentioned manner, the substrate with a base pattern, i.e., the substrate with a desired base pattern formed on the substrate is obtained. The substrate with a base pattern is used in producing a reflective mask blank having a programmed defect or a reflective mask having a programmed defect.

Next, description will be made of a reflective multilayer film.

The reflective multilayer film formed on the base pattern has a structure comprising a plurality of kinds of substances different in refractive index and periodically laminated. The reflective multilayer film is adapted to reflect light having a specific wavelength. For exposure light having a wavelength of, for example, about 13 nm, use may be made of a reflective multilayer film comprising Mo and Si films alternately laminated. Typically, about 40 periods of Mo and Si films are laminated.

Besides, as a reflective multilayer film used in the EUV region, use may be made of a Ru/Si periodic reflective multilayer film, a Mo/Be periodic reflective multilayer film, a Mo-compound/Si-compound periodic reflective multilayer film, a Si/Nb periodic reflective multilayer film, a Si/Mo/Ru periodic reflective multilayer film, a Si/Mo/Ru/Mo periodic reflective multilayer film, and a Si/Ru/Mo/Ru multilayer periodic reflective film. The material of the reflective multilayer film may appropriately be selected in dependence upon the wavelength of the exposure light.

The reflective multilayer film may be formed on the substrate with the base pattern formed thereon, for example, by DC magnetron sputtering. If the reflective multilayer film comprises Mo and Si, sputtering is carried out in an Ar gas atmosphere with a Si target and a Mo target alternately used. 30 to 60 periods, preferably, 40 periods of Si and Mo films are deposited. Finally, a Si film is deposited as a topmost layer. Alternatively, use may be made of IBD (Ion Beam Deposition) in which ion beam sputtering is carried out by alternately irradiating a Si target and a Mo target by an ion beam.

The reflective multilayer film formed on the base pattern must have uniform distribution in thickness throughout the surface of the substrate. If the uniform distribution in thickness is not achieved, it is difficult to control the shape and the size of the protrusion formed on the surface of the reflective multilayer film following the shape of the base pattern. Therefore, in order that the reflective multilayer film has uniform distribution in thickness throughout the surface of the substrate, the reflective multilayer film is preferably deposited by sputtering in a condition that the substrate faced to the surface of the sputter target is rotated around a rotation axis which is a normal passing through the center of the principal surface of the substrate.

More preferably, the reflective multilayer film is deposited by sputtering in a condition that the substrate is rotated with its principal surface inclined at an angle with respect to the surface of the sputter target.

Figure 3:
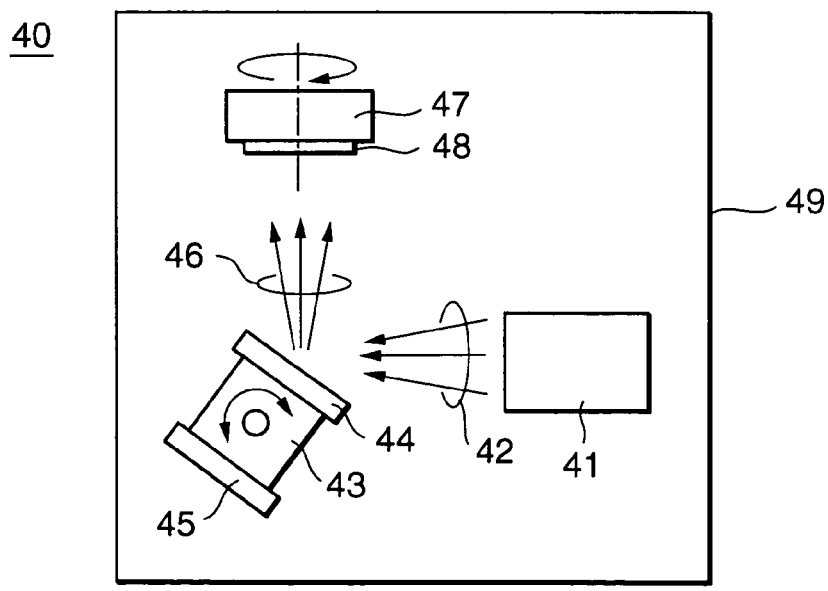
FIG. 3 is a schematic view of an ion beam sputtering apparatus as a deposition apparatus for use in a method of producing a reflective mask blank according to this invention.

For example, the reflective multilayer film may be deposited by the use of an ion beam sputtering apparatus illustrated in FIG. 3. The ion beam sputtering apparatus 40 illustrated in FIG. 3 comprises a sputtering ion source 41, a sputter target supporting member 43, and a substrate supporting member 47. The sputtering ion source 41, the sputter target supporting member 43, and the substrate supporting member 47 are disposed within a vacuum chamber 49.

The sputter target supporting member 43 holds sputter targets 44 and 45 for deposition of the reflective multilayer film at least comprising two materials. The sputter target supporting member 43 has a rotation mechanism so that each target is moved to face the sputtering ion source 41.

The substrate supporting member 47 is faced to the surface of the sputter target. The substrate supporting member 47 has an angle adjusting member (not shown) for positioning the substrate supporting member 47 and a substrate 48 at a predetermined angle with respect to the surface of the sputter target, and a rotation mechanism (not shown) for rotating the substrate 48 around the rotation axis which is the normal passing through the center of the principal surface of the substrate.

In order to deposit the reflective multilayer film by sputtering, ions 42 of an inactive gas are extracted from the sputtering ion source 41 and irradiated onto the sputter target 44 (or 45). Then, atoms constituting the sputter target 44 (or 45) are struck and driven out by collision with the ions to generate a target substance 46. At a position faced to the sputter target 44 (or 45), the substrate supporting member 47 with the substrate 48 mounted thereto is located. The target substance 46 is deposited to the substrate 48 to form a thin film layer (one of thin film layers forming the alternate multilayer film).

Next, the sputter target supporting member 43 is rotated to face the other sputter target 45 (or 44) to the sputtering ion source 41. Then, the other thin film layer forming the alternate reflective film is deposited. By alternately repeating the above-mentioned operations, the reflective multilayer film comprising several tens or several hundreds of layers is formed on the substrate 48.

Figure 4:
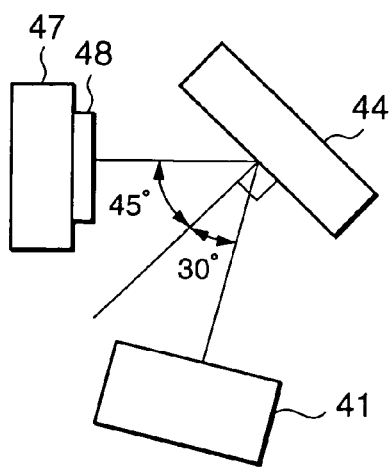
FIG. 4 is a schematic view showing an arrangement of a sputter ion source, a sputter target, and a substrate in the ion beam sputtering apparatus.

For example, as illustrated in FIG. 4, the sputtering ion source 41 is inclined at an angle of 30° with respect to the normal to the sputter target 44 (or 45) and the substrate supporting member 47 is inclined at an angle of 45° with respect to the above-mentioned normal on a side opposite to the sputtering ion source 41.

During the process of depositing the reflective multilayer film on the substrate with the base pattern formed thereon, the reflective multilayer film is grown following the irregularity of the base pattern so that the step portion is formed on the surface of the reflective multilayer film. Thus, a predetermined programmed defect corresponding to the shape and the size of the base pattern is introduced into the reflective multilayer film. Depending upon the deposition technique and the deposition condition of the reflective multilayer film, the shape of the defect formed on the reflective multilayer film is different. Therefore, upon designing the base pattern, the deposition technique for the reflective multilayer film must be taken into consideration.

Figure 5A:
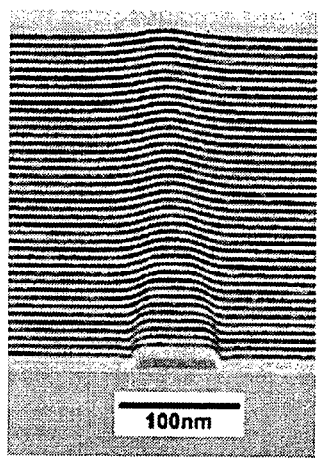
FIGS. 5A through 5C are photographs of reflective multilayer films deposited by sputtering using the ion beam sputtering apparatus illustrated in FIG. 3 in the state where a principal surface of the substrate is inclined at 90°, 110°, and 135° with respect to a surface of the sputter target, respectively.
Figure 5B:
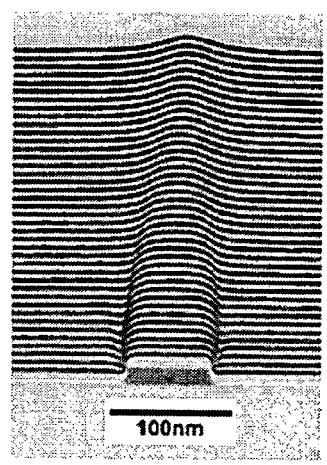
Figure 5C:
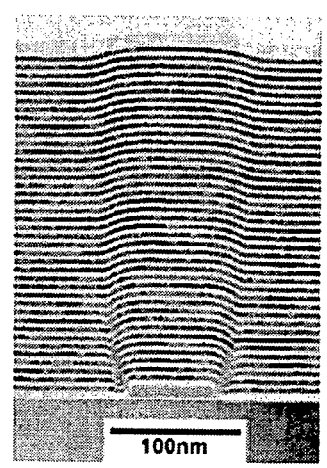

For example, when the reflective multilayer film is deposited by the use of the ion beam sputtering apparatus illustrated in FIG. 3, the principal surface of the substrate is inclined at angles of 90°, 110°, and 135° with respect to the surface of the sputter target. As illustrated in FIGS. 5A to 5C (FIGS. 5A, 5B, and 5C corresponding to 90°, 110°, and 135°, respectively), it is confirmed that the height, the size, and the shape of the step portion formed on the surface of the reflective multilayer film is varied even if the shape and the size of the base pattern are unchanged. Thus, by controlling the angle of the principal surface of the substrate with respect to the surface of the sputter target, it is possible to easily control the height, the size, and the shape of the step portion formed on the principal surface of the reflective multilayer film and to control the degree of the phase defect.

By forming the reflective multilayer film on the substrate provided with the base pattern in the above-mentioned manner, it is possible to obtain a mask blank having a programmed defect, in which the programmed defect having a predetermined shape and a predetermined size is formed at a predetermined position. In the mask blank having a programmed defect according to this invention, the defect having a desired shape and a desired size can be formed at a desired position because the base pattern is formed preliminarily taking into account the relationship between the base pattern formed on the substrate and the defect formed on the reflective multilayer film following the base pattern. In particular, by forming a microscopic convex portion or a microscopic concave pattern as the base pattern, a microscopic convex or concave shape on the order of several nanometers is controllably formed on the surface of the reflective multilayer film. For example, in case where the base pattern is formed by patterning the thin film formed on the substrate, a microscopic irregularity can be formed by controlling the thickness of the thin film.

Preferably, the surface roughness of the reflective multilayer film in the above-mentioned mask blank having a programmed defect falls within a range greater than 0 nm and not greater than 0.2 nm in root-mean-square roughness (Rms). More preferably, the surface roughness falls within a range greater than 0 nm and not greater than 0.15 nm. If the surface roughness of the reflective multilayer film is large, the sensitivity of a defect inspection apparatus is degraded so that a desired sensitivity in inspection of the EUV reflective mask blank can not be achieved.

Figure 6:
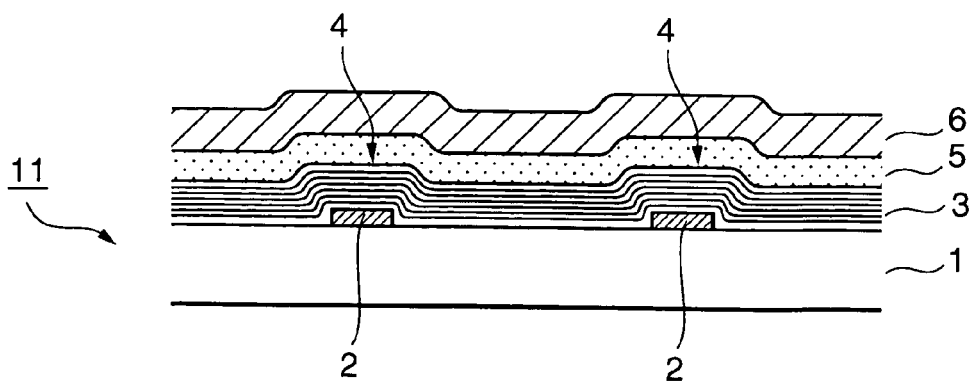
FIG. 6 is a sectional view of a reflective mask blank having a programmed defect, in which a buffer layer and an absorber layer are formed on a reflective multilayer film.

The above-mentioned reflective mask blank having a programmed defect may have another film on the reflective multilayer film. For example, the reflective mask blank may have an absorber layer made of a material absorbing the exposure light. Further, a buffer layer resistant against an environment upon pattern formation to the absorber layer may be formed between the absorber layer and the reflective multilayer film. Referring to FIG. 6, a reflective mask blank 11 having a programmed defect comprises the buffer layer 5 and the absorber layer 6 which are formed on the reflective multilayer film 3 with the programmed defect formed thereon. The reflective mask blank having a programmed defect with the absorber layer formed on the reflective multilayer film may be used for manufacturing a reflective mask having a programmed defect which will later be described. The material and the layer structure of each of the absorber layer and the buffer layer may be selected in conformity with the structure of each of a reflective mask blank product and a reflective mask product to be evaluated and inspected by the use of the mask blank having a programmed defect and the mask having a programmed defect.

For example, in case where the absorber layer is made of a material containing Ta as a main component, the buffer layer is preferably made of a material containing Cr as a main component. The material containing Cr as a main component has etch resistance as high as 20 times or more as compared with Ta with respect to a chlorine-containing gas as an etching gas for the absorber layer containing Ta as a main component.

In case where the absorber layer is made of a material containing Cr as a main component, the buffer layer is preferably made of a material containing Ta as a main component.

The material containing Cr or Ta as a main component and adapted to be used as the absorber layer or the buffer layer may be similar to the material of the thin film to form the base pattern.

Alternatively, the absorber layer may be made of a material containing W or Ti as a main component. The buffer layer may be made of a material such as $SiO_2$ and C which is appropriately selected depending upon the type of the absorber layer.

Next, description will be made of production of the mask blank having a programmed defect with the buffer layer and the absorber layer.

In the manner mentioned above, the reflective multilayer film is formed on the substrate provided with the base pattern. Thus, the substrate having the reflective multilayer film with the phase defect introduced therein is prepared.

On the reflective multilayer film, the buffer layer is formed. The buffer layer may be formed by sputtering or the like. For example, the buffer layer comprising a chromium nitride film may be formed by sputtering using a Cr target and a gas containing nitrogen. The buffer layer is required to have a thickness sufficiently resistant against an etching process and a repair process for the absorber layer. The structure of the buffer layer may be selected in conformity with the structure of each of the reflective mask blank product and the reflective mask product to be evaluated and inspected by the use of the mask blank having a programmed defect and the mask having a programmed defect.

Next, the absorber layer is formed on the buffer layer. The absorber layer may also be formed by sputtering or the like. For example, the absorber layer comprising a film containing Ta and B may be formed by sputtering using a target containing Ta and B. The absorber layer has a thickness such that the exposure light is sufficiently absorbed in a nonreflecting region of the mask and is preferably as thin as possible. The structure of the absorber layer may also be selected in conformity with the structure of each of the reflective mask blank product and the reflective mask product to be evaluated and inspected by the use of the mask blank having a programmed defect and the mask having a programmed defect.

In the above-mentioned manner, the buffer layer 5 and the absorber layer 6 are formed on the reflective multilayer film 3 with the programmed defect formed thereon. Thus, the reflective mask blank 11 having a programmed defect as illustrated in FIG. 6 is obtained.

The buffer layer is provided if appropriate and may not be formed.

Next, description will be made of the reflective mask having a programmed defect.

The reflective mask having a programmed defect is obtained by forming a predetermined pattern on the absorber layer of the reflective mask blank having a programmed defect. As described above, the reflective mask blank having a programmed defect comprises the substrate provided with the base pattern, the reflective multilayer film formed on the substrate and having the programmed defect introduced therein, and at least the absorber layer formed on the reflective multilayer film.

Figure 7:
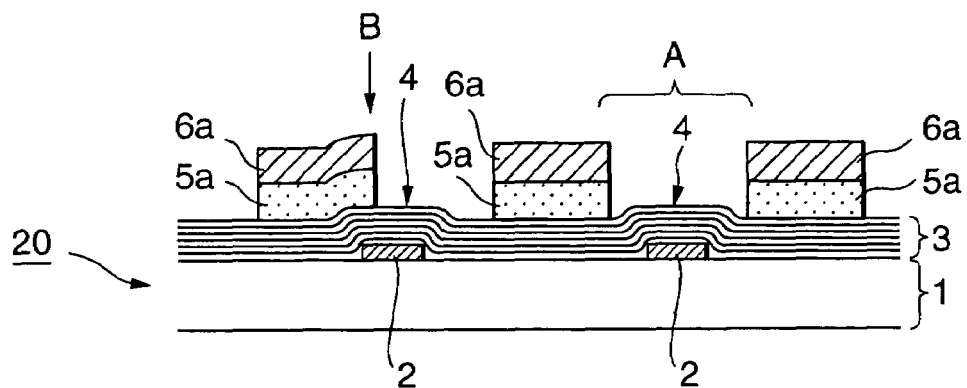
FIG. 7 is a sectional view of a reflective mask with a programmed defect, with a pattern formed on an absorber layer.

In case where the buffer layer is formed between the absorber layer and the reflective multilayer film, the buffer layer is partially removed to form a pattern in correspondence to the absorber pattern, if appropriate. Whether or not the pattern is formed on the buffer layer is determined in conformity with the structure of each of the reflective mask blank product and the reflective mask product to be evaluated and inspected by the use of the mask having a programmed defect. Referring to FIG. 7, a reflective mask 20 having a programmed defect is obtained by forming predetermined patterns 6a and 5a on the absorber layer 6 and the buffer layer 5 of the reflective mask blank having a programmed defect, in which the buffer layer 5 and the absorber layer 6 are formed on the reflective multilayer film 3.

The above-mentioned reflective mask having a programmed defect is used in evaluation and inspection of a defect formed on the reflective multilayer film. Therefore, the absorber pattern is preferably formed so that an area of the defect formed on the reflective multilayer film is contained in a reflecting region. FIG. 7 shows the case where the protrusion 4 as the defect is present in the reflecting region (A in the figure) between adjacent absorber patterns and the case where the protrusion 4 as the defect is present at a boundary (B in the figure) between a nonreflecting region comprising the absorber pattern and the reflecting region where the reflective multilayer film is exposed. Without being restricted thereto, the positional relationship and the dimensional relationship between the absorber pattern and the programmed defect may be appropriately selected in dependence upon the purpose of the inspection and the evaluation.

Next, production of the above-mentioned reflective mask having a programmed defect will be described.

The pattern formation to the absorber layer may be carried out by the use of lithography. At first, a resist layer is formed on the absorber layer. A pattern is formed on the resist layer. The pattern may be formed by electron beam writing or exposure.

Next, using the resist pattern as a mask, the pattern is transferred to the absorber layer by a technique such as etching. For example, in case where the absorber layer is made of a material containing Ta as a main component, dry etching using a gas containing chlorine may be carried out. A black defect or a white defect produced in the absorber pattern is repaired by FIB (Focused Ion Beam). In case where the buffer layer is present between the absorber layer and the buffer layer, the buffer layer serves as an etch stopper layer to protect the reflective multilayer film from damage upon forming and repairing the pattern on the absorber layer. If necessary, the buffer layer is partially removed in accordance with the pattern of the absorber layer to expose the reflective multilayer film.

The buffer layer may be removed by etching. For example, in case where the buffer layer is made of a material containing Cr as a main component, the buffer layer may be removed by dry etching using a gas containing chlorine and oxygen or wet etching using a Cr remover. The condition for removing the buffer layer is selected so as to suppress a damage upon the reflective multilayer film.

In the above-mentioned manner, the reflective mask having a programmed defect, in which the predetermined pattern is formed on the absorber layer, is obtained.

The reflective mask having a programmed defect according to this invention is provided with the programmed defect having a desired shape and a desired size and formed at a predetermined position and is particularly useful in evaluation and inspection of the reflective mask product.

Figure 8:
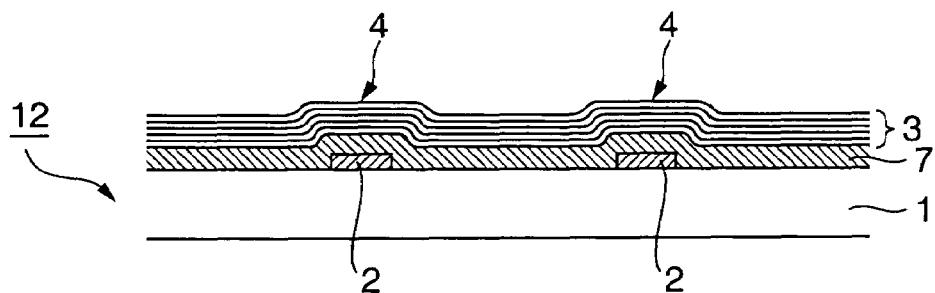
FIG. 8 is a sectional view of a reflective mask blank having a programmed defect, in which a base intermediate layer is formed between a base pattern and a reflective multilayer film.

In the foregoing embodiment, the reflective multilayer film is formed on the substrate provided with the base pattern. As another embodiment, another film as a base intermediate film may be formed between the substrate provided with the base pattern and the reflective multilayer film. Referring to FIG. 8, the base intermediate film 7 is formed between the substrate 1 provided with the base pattern 2 and the reflective multilayer film 3.

By providing the base intermediate film, it is possible to control the shape of the defect formed on the reflective multilayer film, for example, to round the surface of the defect. The shape of the defect may be controlled by the deposition technique to some extent but may be controlled by the base intermediate film.

If the base intermediate film is excellent in flatness and smoothness, the flatness and smoothness of the surface of the reflective multilayer film is improved. In view of the above, the base intermediate film preferably has a surface roughness of 0.2 nmRms or less.

Further, by providing the base intermediate film, the adhesion between the base pattern and the reflective multilayer film is improved. Depending upon the shape of the base pattern and the deposition technique of the reflective multilayer film, a space tends to be left between the base pattern and the reflective multilayer film. In this event, by providing the base intermediate film, the adhesion between the base pattern and the reflective multilayer film is improved to suppress the occurrence of the space.

As a material of the base intermediate film, the material excellent in flatness and smoothness is preferable. In this respect, an amorphous material is preferable. For example, the amorphous material containing Si or Ta as a main component may be used. In particular, in order to improve the flatness and smoothness, use is preferably made of a TaB alloy, Si or the like excellent in flatness and smoothness.

The base intermediate film is formed so as to cover the surface of the substrate with the base pattern formed thereon. The base pattern may be formed so as to cover either an entire region or a part of the surface of the substrate. The base intermediate layer may comprise a single-layer film or a multilayer film. The base intermediate film may be deposited by appropriately selecting a known deposition technique. The thickness of the base intermediate film is not particularly restricted but typically falls within a range between 20 and 200 nm.

For example, the evaluation and the inspection of the defect may be carried out by making inspection light be incident to the reflective mask or the reflective mask blank and detecting scattered light. As the inspection light, visible light, deep ultraviolet light, EUV light, or the like may be used depending upon the purpose. In such inspection, the reflective mask having a programmed defect or the reflective mask blank having a programmed defect according to this invention may be used for calibration of the inspection apparatus, evaluation of the phase defect, evaluation of influence upon the transferability, development of a defect repairing technique using FIB or EB, analysis of the defect on the multilayer reflective film, and so on.

For example, in the reflective mask blank having a programmed defect as illustrated in FIG. 1 in which the reflective multilayer film is formed on the substrate provided with the base pattern, the reflective multilayer film is preliminarily provided with a predetermined programmed defect. Therefore, the reflective mask blank having a programmed defect may be used to survey the influence of the defect upon the reflectivity or may be used in product inspection as a reference sample for identifying the size and the type of the defect detected in the product inspection. The reflective mask blank having a programmed defect illustrated in FIG. 6 comprises the absorber layer and is used to produce the reflective mask having a programmed defect in which the pattern is formed on the absorber layer. The reflective mask having a programmed defect illustrated in FIG. 7 has the absorber pattern formed in a predetermined relationship with respect to the defect and may be used for evaluation of the influence of the positional relationship between the absorber pattern and the defect upon a transferred image.

According to this invention, it is possible to introduce a defect having a desired size and a desired defect to a desired position. In other words, it is possible to produce a reflective mask blank and a reflective mask with a desired defect preliminarily programmed. Since a plurality of defects different in size and shape can be formed on a single substrate, evaluation of various defects and adjustment of the inspection apparatus can be carried out by the use of the single substrate.

Next, this invention will be described more in detail in conjunction with specific examples. The index Rms representative of the surface roughness in this invention is a root-mean-square roughness and can be measured by an atomic force microscope. The flatness in this invention is a value representative of surface warp (deformation) given by TIR (Total Indicated Reading). This value is obtained as follows. A focal plane is defined as a plane determined by a least square method with respect to the surface of the substrate. Calculation is made of a difference in level between a highest position and a lowest position of the surface of the substrate above and below the focal plane, respectively. An absolute value of the above-mentioned difference is given as the flatness. The surface roughness is given by a value in a 10 μm square area while the flatness is given by a value in a 142 mm square area.

EXAMPLE 1

As a substrate, preparation was made of a low-expansion $SiO_2$-$TiO_2$ glass substrate having an outer dimension of 6-inch square and a thickness of 6.3 mm. The glass substrate was subjected to mechanical polishing to have a surface roughness of 0.12 nmRms and a flatness of 100 nm or less.

Next, on the glass substrate, a chromium nitride film was formed as a thin film to form a base pattern. The chromium nitride film was deposited by DC magnetron sputtering using a Cr target and a sputter gas of Ar and $N_2$. The chromium nitride film thus obtained was represented by CrNx (x=0.2) and had a microcrystalline structure. Taking into account the relationship with the programmed defect to be formed, the thickness of the chromium nitride film was 4 nm which is equal to the height of a protrusion of a desired defect (to be formed on a reflective multilayer film). The film had a surface roughness of 0.15 nmRms and was very flat and smooth.

Next, a pattern was formed on the chromium nitride film as the base pattern. At first, the chromium nitride film was coated with an EB resist. By electron beam writing and development, a resist pattern was formed at a predetermined position where the defect was to be formed. The shape and the size of the resist pattern were selected in correspondence to the shape and the size of the desired defect. Specifically, in order to obtain convex defects having widths of 30 nm, 50 nm, 100 nm, and 200 nm on the reflective multilayer film, the resist pattern corresponding to base patterns as dot patterns having widths of 25 nm, 45 nm, 95 nm, and 195 nm was formed. With the resist pattern used as a mask, the chromium nitride film was dry-etched using a mixed gas of chlorine and oxygen to form the base patterns. Thus, a substrate for producing a reflective mask blank was obtained. At this time, no substantial damage was caused in the glass substrate and an exposed surface of the substrate maintained its initial flatness and smoothness.

Then, on the substrate provided with the base patterns, an alternate lamination film comprising Mo and Si and suitable as a reflection film for an exposure wavelength in a range of 13-14 nm was deposited as the reflective multilayer film. Deposition was carried out by DC magnetron sputtering. At first, a Si film was deposited to the thickness of 4.2 nm by the use of a Si target in an Ar gas atmosphere kept at a pressure of 0.1 Pa. Then, a Mo film was deposited to the thickness of 2.8 nm by the use of a Mo target in an Ar gas atmosphere kept at a pressure of 0.1 Pa. The above-mentioned deposition of the single Si film and the single Mo film was defined as a single period. After deposition of 40 periods, another Si film was finally deposited to the thickness of 4 nm. The total thickness was equal to 284 nm. In the process of forming the reflective multilayer film, the reflective multilayer film was grown following the shape of the base patterns.

For a portion of the reflective mask blank without the defect, the reflectivity was measured by the use of EUV light having a wavelength of 13.4 nm and an incident angle of 5°. As a result, the reflectivity was equal to 65%. Thus, the reflection characteristic was excellent. Further, by the use of an AFM (atomic force microscope), it was confirmed that the defect having a height of 4 nm equal to the height of the base pattern of chromium nitride was formed on the surface of the reflective multilayer film above a portion where the base pattern of chromium nitride was formed on the substrate. The width of the defect was greater than the width of the base pattern of chromium nitride and was substantially coincident with the designed width. The surface roughness of the reflective multilayer film was 0.13 nmRms. Thus, the reflective mask blank having a programmed defect had high flatness and smoothness. The surface roughness of the glass substrate, the surface roughness of the base pattern, and the surface roughness of the reflective multilayer film were measured by the atomic force microscope. The surface roughness in the following examples was also measured by the atomic force microscope.

In the reflective mask blank having a programmed defect in this example obtained as mentioned above, the microscopic programmed defects can be introduced into the reflective multilayer film by forming the microscopic base patterns on the substrate. Therefore, the reflective mask blank having a programmed defect in this example is applicable to inspection and evaluation of the reflective mask blank and the reflective mask used in a short-wavelength region and may be used as a reference sample for calibration of an inspection apparatus for evaluating and inspecting a microscopic defect, a sample for evaluation of a phase defect, a sample for development of a defect correction technique using FIB or EB, a sample for analyzing a defect of a multilayer film, a sample for evaluation of a transferability of a reflective mask, and so on.

EXAMPLE 2

On the reflective multilayer film of the mask blank obtained in Example 1, a chromium nitride film was formed as a buffer layer. Deposition was carried out by DC magnetron sputtering using a Cr target and a sputter gas of Ar and nitrogen. In order to assure sufficient resistance against etching of an absorber layer containing Ta as a main component (which will later be described), the thickness of the chromium nitride film was 20 nm. The chromium nitride film thus obtained was represented as $CrN_x$ (x=0.1) and had a microcrystalline structure.

Next, on the buffer layer, a film containing Ta as a main component and B, N, and O added thereto was formed as the absorber layer for exposure light having a wavelength of 13-14 nm. Deposition was carried out by DC magnetron sputtering using a target containing Ta and B and a sputter gas comprising Ar with 10% nitrogen and 40% oxygen added thereto. The thickness was 70 nm so that the exposure light is sufficiently absorbed. In the TaBNO film thus deposited, B, N, and O were 0.1, 0.1, and 0.4, respectively.

As described above, the reflective mask blank having a programmed defect in Example 2 was obtained. Like in Example 1, the reflective mask blank having a programmed defect in Example 2 is applicable to inspection and evaluation of the reflective mask blank and the reflective mask used in a short-wavelength region and may be used as a reference sample for calibration of an inspection apparatus for evaluating and inspecting a microscopic defect, a sample for evaluation of a phase defect, a sample for development of a defect correction technique using FIB or EB, a sample for analyzing a defect of a multilayer film, a sample for evaluation of a transferability of a reflective mask, and so on.

EXAMPLE 3

In the reflective mask blank having a programmed defect produced in Example 2, a pattern was formed on the absorber layer to produce a reflective mask having a programmed defect with the pattern for 16 Gbit-DRAM having a design rule of 0.07 μm. At first, the reflective mask blank having a programmed defect was coated with an EB resist. By EB writing and development, a resist pattern was formed.

Next, using the resist pattern as a mask, the TaBNO film as the absorber layer was dry-etched using chlorine to form an absorber pattern. Taking into account the relationship with the defects formed on the reflective multilayer film, the absorber pattern was formed so that the defects were exposed in the reflecting region near the absorber pattern.

The $CrN_x$ film as the exposed buffer layer was dry-etched by the use of a mixed gas of chlorine and oxygen and removed following the absorber pattern to expose the reflective multilayer film.

In the above-mentioned manner, the reflective mask having a programmed defect was obtained.

For the reflective mask having a programmed defect thus obtained, the reflectivity was measured by EUV light having a wavelength of 13.4 nm and an incident angle of 5°. As a result, the reflectivity was 65% in a portion without the phase defect. Thus, the reflection characteristic was excellent.

Figure 9:
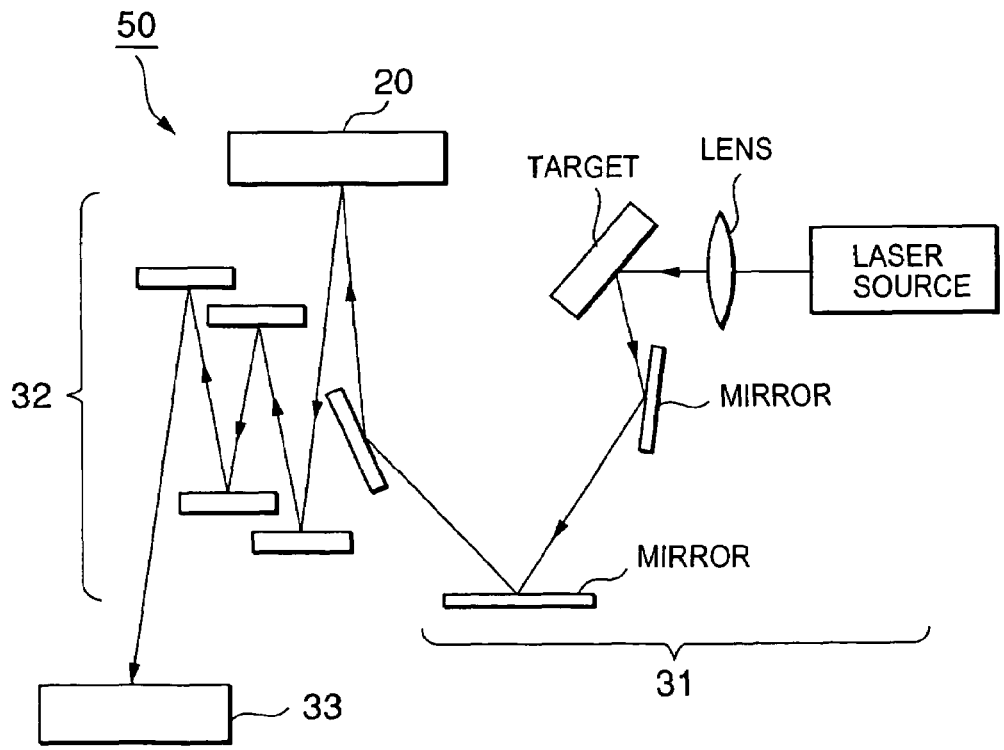
FIG. 9 is a schematic view of a pattern transfer apparatus.

Next, by the use of a pattern transfer apparatus illustrated in FIG. 9, a transferred image was evaluated. At first referring to FIG. 9, description will be made of pattern transfer onto a semiconductor substrate by the use of the reflective mask.

The pattern transfer apparatus 50 illustrated in FIG. 9 comprises a laser plasma X-ray source 31, a reflective mask 20, and a reducing optical system 32. EUV light (soft X-ray) emitted from the laser plasma X-ray source 31 is incident to the reflective mask 20. The light reflected by the reflective mask 20 passes through the reducing optical system 32 and is directed to, for example, a Si wafer 33 to transfer the pattern. As the reducing optical system 32, an X-ray reflection mirror may be used. By the reducing optical system 32, the pattern reflected by the reflective mask 20 is typically reduced to about ¼.

For example, pattern transfer to the Si wafer 33 can be carried out by exposing the pattern on a resist layer formed on the Si wafer 33 and developing the pattern. In case where the wavelength band of 13-14 nm is used as the exposure wavelength, transfer is typically carried out in the manner such that an optical path is positioned in vacuum.

By the use of the above-mentioned pattern transfer apparatus and the reflective mask having a programmed defect in Example 3, exposure to the Si wafer was carried out using the exposure light having a wavelength of 13.4 nm. As a result, in a portion with the defect, an error in pattern width was observed and the influence of the defect upon the transfer accuracy was evaluated. Thus, it has been confirmed that the defect can be inspected and evaluated by the use of the reflective mask having a programmed defect in Example 3.

EXAMPLE 4

A reflective mask blank having a programmed defect was produced in the manner similar to Example 1 except that, in Example 4, an upper surface of a base pattern was a curved surface and the thickness of a chromium nitride film forming the base pattern was 8 nm, taking into account the relationship with the size of the defect to be formed on a reflective multilayer film.

The curved surface was formed on the upper surface of the base pattern of chromium nitride in the following manner. At first, a resist pattern similar to that in Example 1 was formed on the chromium nitride film. Thereafter, the resist pattern was baked at a high temperature of 250° C. to form a convex curved surface on an upper surface of the resist pattern. Next, using the resist pattern as a mask, the chromium nitride film was dry-etched in the manner similar to Example 1. Etching was carried out until the resist film for forming the resist pattern was just completely removed. Thus, the shape of the resist pattern was transferred to the chromium nitride film. As a result, a substrate for producing a reflective mask blank was obtained. The substrate was provided with base patterns as dot patterns which had the widths of 25 nm, 45 nm, 95 nm, and 195 nm and each of which had the upper surface as the convex curved surface.

On the above-mentioned base patterns, the Mo/Si reflective multilayer film was formed in the manner similar to Example 1 to form the reflective mask blank. As a result, a part of the reflective multilayer film above the portion provided with the base pattern had the upper surface (the surface of the reflective multilayer film) as a convex curved surface, following the shape of the base pattern. The height of the defect formed on the reflective multilayer film was about a half of the height of the base pattern. The width of the defect was greater than that of the base pattern like in Example 1 and was substantially identical to the designed width. The reflective multilayer film had a surface roughness of 0.13 nmRms. Thus, the reflective mask blank having a programmed defect had high flatness and smoothness.

In the manner similar to that mentioned above, the reflective mask blank having a programmed defect in Example 4 is applicable to inspection and evaluation of the reflective mask blank and the reflective mask used in a short-wavelength region and may be used as a reference sample for calibration of an inspection apparatus for evaluating and inspecting a microscopic defect, a sample for evaluation of a phase defect, a sample for development of a defect correction technique using FIB or EB, a sample for analyzing a defect of a multilayer film, a sample for evaluation of a transferability of a reflective mask, and so on.

Further, on the reflective multilayer film, a chromium nitride buffer layer and a TaBNO absorber layer similar to those in Example 2 were formed. In the manner similar to Example 3, a pattern was formed on the absorber layer to produce a reflective mask having a programmed defect.

By the use of the reflective mask having a programmed defect, exposure was carried out in the manner similar to Example 3. As a result, in a portion provided with the defect, an error in pattern width was observed and the influence of the defect upon the transfer accuracy was evaluated. Thus, it has been confirmed that the reflective mask having a programmed defect can be used for a transfer test and a defect inspection.

EXAMPLE 5

A chromium nitride film for forming a base pattern was formed on a glass substrate in the manner similar to Example 1 except that the thickness of the chromium nitride film was 5 nm. The film had a surface roughness of 0.15 nmRms and was very flat and smooth.

A pattern was formed on the chromium nitride film as the base pattern in the manner similar to Example 1 except that the width of the pattern was 50 nm.

Next, so as to cover an entire surface of the substrate provided with the base pattern, a $Ta_4B$ film as a base intermediate film was formed. Thus, a substrate for producing a reflective mask blank was obtained. Deposition was carried out by DC magnetron sputtering using a target containing Ta and B. The thickness of the film was 50 nm. The film had a surface roughness of 0.15 nmRms and was very flat and smooth.

Next, on the base intermediate film, a Mo/Si reflective multilayer film was formed in the manner similar to Example 1. Thus, the reflective mask blank was produced. The reflective multilayer film had a very flat and smooth surface having a surface roughness of 0.13 nmRms. The height of the defect formed on the reflective multilayer film was 3 nm which was lower than the height of the base pattern. The width of the defect was 60 nm which was greater than that of the base pattern, like in Example 1. Although the base pattern had a rectangular shape, the phase defect formed on the surface of the reflective multilayer film had a dome-like shape with a rounded surface. The section of the blank was observed by a TEM (transmission electron microscope). As a result, the base intermediate layer was present between the base pattern and the reflective multilayer film without leaving a gap.

In the manner similar to that mentioned above, the reflective mask blank having a programmed defect in Example 5 is applicable to inspection and evaluation of the reflective mask blank and the reflective mask used in a short-wavelength region and may be used as a reference sample for calibration of an inspection apparatus for evaluating and inspecting a microscopic defect, a sample for evaluation of a phase defect, a sample for development of a defect correction technique using FIB or EB, a sample for analyzing a defect of a multilayer film, a sample for evaluation of a transferability of a reflective mask, and so on.

Further, on the reflective multilayer film, a chromium nitride buffer layer and a TaBNO absorber layer similar to those in Example 2 were formed. In the manner similar to Example 3, a pattern was formed on the absorber layer. Thus, a reflective mask having a programmed defect was produced. By the use of the reflective mask having a programmed defect, a transferred image was evaluated in the manner similar to Example 3. As a result, an error in pattern width was observed in the vicinity of the defect and the influence of the defect upon the transfer accuracy was evaluated. Thus, it has been confirmed that the reflective mask having a programmed defect in Example 5 can be used in a transfer test and a defect inspection.

EXAMPLE 6

A chromium nitride film for producing a base pattern was formed on a glass substrate in the manner similar to Example 1 except that the chromium nitride film had a thickness of 2 nm. Next, in the manner similar to Example 1, base patterns as dot patterns different in size as illustrated in FIG. 1C were formed on the glass substrate. Thus, a substrate for producing a reflective mask blank was obtained. The dot patterns increased in size by 20 nm per one side from the minimum size of 20 nm x 20 nm to the maximum size of 200 nm x 200 nm were produced in a center area of the glass substrate at equal intervals.

Next, on the substrate with the base pattern formed thereon, an alternate lamination film comprising Mo and Si was formed by ion beam sputtering to the thickness identical to that in Example 1. Thus, a reflective mask blank having a programmed defect was obtained. Deposition by sputtering was carried out under the following condition. Specifically, the inclination angle of the principal surface of the substrate with respect to the surface of the sputter target was selected so that the size of a protrusion (defect) formed on the reflective multilayer film was substantially same as that of the base pattern. The size of the programmed defect formed on the reflective multilayer film of the reflective mask blank obtained as mentioned above was measured. As a result, dot patterns same in size to the base patterns in conformity with the design were confirmed.

In the manner similar to that mentioned above, the reflective mask blank having a programmed defect in Example 6 is applicable to inspection and evaluation of the reflective mask blank and the reflective mask used in a short-wavelength region and may be used as a reference sample for calibration of an inspection apparatus for evaluating and inspecting a microscopic defect, a sample for evaluation of a phase defect, a sample for development of a defect correction technique using FIB or EB, a sample for analyzing a defect of a multilayer film, a sample for evaluation of a transferability of a reflective mask, and so on.

Further, on the reflective multilayer film, a chromium nitride buffer layer and a TaBNO absorber layer similar to those in Example 2 were formed. In the manner similar to Example 3, a pattern was formed on the absorber layer. Thus, a reflective mask having a programmed defect was produced. By the use of the reflective mask having a programmed defect, a transferred image was evaluated in the manner similar to Example 3. As a result, an error in pattern width was observed in the vicinity of the defect and the influence of the defect upon the transfer accuracy was evaluated. Thus, it has been confirmed that the reflective mask having a programmed defect in Example 6 can be used in a transfer test and a defect inspection.

In the foregoing examples, the base patterns, the buffer layer, and the absorber layer except the reflective multilayer film may be deposited by ion beam deposition using an ion beam sputtering apparatus instead of DC magnetron sputtering.

On a single substrate (a substrate for producing a reflective mask blank, a reflective mask blank, a reflective mask), base patterns different in shape (for example, a dot pattern and a line pattern, a convex pattern and a concave pattern) or base patterns different in height may be formed.

As described above, according to this invention, it is possible to obtain a reflective mask blank having a programmed defect and a reflective mask having a programmed defect which can be used in evaluation and inspection of a reflective mask used in lithography particularly in a short-wavelength region and a reflective mask blank for producing the reflective mask.

According to this invention, the reflective multilayer film is formed on the substrate with the base pattern formed thereon so as to introduce a programmed defect having a desired shape and a desired size at a desired position of the reflective multilayer film. Therefore, the reflective mask having a programmed defect and the reflective mask blank having a programmed defect according to this invention are advantageously used for evaluation and inspection of a reflective mask and a reflective mask blank for producing the reflective mask.

In the embodiments and the examples described above, the base pattern is formed on the principal surface of the substrate and the reflective multilayer film is formed on the base pattern. So as to form a step portion causing phase change in reflected light of the incident exposure light, use may be made of other various structures. For example, use may be made of a structure comprising a first reflective multilayer film having a predetermined thickness and formed on the principal surface of the substrate, a base pattern having a predetermined irregularity formed on the first reflective multilayer film, and a second reflective multilayer film having a predetermined thickness and formed on the base pattern. As an alternate structure, a smoothing layer, a flattening layer, or a film stress controlling layer for controlling the film stress of a reflective multilayer film may be formed on the principal surface of the substrate and the base pattern having a predetermined irregularity may be formed thereon. Further, the reflective multilayer film having a predetermined thickness is formed on the base pattern.

What is claimed is:

1. A reflective mask blank having a programmed defect, comprising a substrate and a reflective multilayer film formed on the substrate to reflect exposure light incident to the reflective multilayer film, the substrate having a principal surface provided with a base pattern which has a predetermined shape and a predetermined size and which is formed at a predetermined position on the substrate, the reflective multilayer film formed on the base pattern having a principal surface provided with a step portion corresponding to the base pattern so that the reflective multilayer film has the programmed defect, the step portion causing a phase change in reflected light obtained by reflecting the exposure light.

2. A reflective mask blank having a programmed defect as claimed in claim 1, wherein the base pattern is formed by a patterned thin film.

3. A reflective mask blank having a programmed defect as claimed in claim 2, wherein the thin film forming the base pattern is made of a material containing Cr or Ta as a main component.

4. A reflective mask blank having a programmed defect as claimed in claim 3, wherein the thin film forming the base pattern is made of a material containing Cr and at least N or a material containing Ta and at least B.

5. A reflective mask blank having a programmed defect as claimed in any one of claims 1, 2, 3, and 4, further comprising a base intermediate film formed between the base pattern and the reflective multilayer film.

6. A reflective mask blank having a programmed defect as claimed in any one of claims 1, 2, 3, and 4, wherein the reflective multilayer film comprises Mo and Si films alternately laminated.

7. A reflective mask blank having a programmed defect as claimed in any one of claims 1, 2, 3, and 4, further comprising an absorber layer made of a material absorbing the exposure light and formed on the reflective multilayer film.

8. A reflective mask having a programmed defect, comprising a reflective mask blank having a programmed defect claimed in claim 7 and a mask pattern formed on the absorber layer of the reflective mask blank.

9. A reflective mask blank having a programmed defect as claimed in any one of claims 1, 2, 3, and 4, wherein the exposure light is EUV light.

10. A reflective mask blank having a programmed defect as claimed in any one of claims 1, 2, 3, and 4, wherein the reflective multilayer film has a surface roughness greater than 0 nm and not greater than 0.2 nm in root-mean-square roughness (Rms).

11. A reflective mask blank having a programmed defect as claimed in claim 1, wherein the reflective multilayer film has the principal surface provided with a plurality of step portions as the step portion which are different in size and/or different in shape.

12. A method of producing a reflective mask blank comprising a substrate and a reflective multilayer film formed on the substrate to reflect exposure light, the method comprising the steps of:

forming a base pattern comprising a predetermined irregularity on a principal surface of the substrate; and forming the reflective multilayer film on the base pattern to thereby form a step portion on a principal surface of the reflective multilayer film corresponding to the base pattern so that a programmed defect is formed on the reflective multilayer film;

the reflective multilayer being deposited by sputtering in a condition that the substrate is placed so that the principal surface of the substrate is inclined at an angle with respect to a surface of a sputter target for deposition of the multilayer reflective film and the substrate is rotated around a rotation axis which is a normal passing through the center of the principal surface of the substrate.

13. A method of producing a reflective mask blank as claimed in claim 12, wherein the angle of the substrate with respect to the surface of the sputter target is controlled to thereby control at least one of the height, the size, and the shape of the step portion formed on the principal surface of the reflective multilayer film.

14. A method of producing a reflective mask blank as claimed in any one of claims 12 and 13, wherein an absorber layer made of a material absorbing the exposure light is formed on the reflective multilayer film.

15. A method of producing a reflective mask, the method comprising the step of preparing a reflective mask blank having a programmed defect by a method claimed in claim 14 and forming a mask pattern on an absorber layer of the reflective mask blank.

* * * * *